United States Patent [19]

Thaler

[11] Patent Number: 5,612,099
[45] Date of Patent: Mar. 18, 1997

[54] METHOD AND APPARATUS FOR COATING A SUBSTRATE

[75] Inventor: Stephen L. Thaler, Independent City, Mo.

[73] Assignee: McDonnell Douglas Corporation, St. Louis, Mo.

[21] Appl. No.: 447,403

[22] Filed: May 23, 1995

[51] Int. Cl.⁶ ............... B05D 3/00; B05D 3/12; C23C 14/30; H05B 7/00
[52] U.S. Cl. ............ 427/565; 427/561; 427/555; 427/596; 427/184; 427/189
[58] Field of Search .................. 427/446, 455, 427/554, 561, 586, 596, 597, 565, 600, 184, 190, 191, 192, 193, 189

[56] References Cited

U.S. PATENT DOCUMENTS

| | | |
|---|---|---|
| 4,300,474 | 11/1981 | Livsey . |
| 4,349,583 | 9/1982 | Kulynych et al. . |
| 4,714,628 | 12/1987 | Eloy ........................................ 427/586 |
| 4,743,733 | 5/1988 | Mehta et al. . |
| 4,766,009 | 8/1988 | Imura et al. . |
| 4,810,525 | 3/1989 | Morita et al. . |
| 4,832,982 | 5/1989 | Mori et al. . |
| 4,947,463 | 8/1990 | Matsuda . |
| 5,043,548 | 8/1991 | Whitney et al. . |
| 5,122,632 | 6/1992 | Kinkelin . |
| 5,254,832 | 10/1993 | Gartner et al. .................... 427/596 |
| 5,281,575 | 1/1994 | Hase et al. ...................... 427/596 |
| 5,292,418 | 3/1994 | Morita et al. . |
| 5,320,882 | 6/1994 | Chen . |
| 5,409,741 | 4/1995 | Laude ..................................... 427/555 |
| 5,415,901 | 5/1995 | Tanaka et al. ...................... 427/586 |

Primary Examiner—Marianne Padgett
Attorney, Agent, or Firm—Bell, Seltzer, Park & Gibson, P.A.

[57] ABSTRACT

A method and apparatus for coating the surface of a substrate suspends a coating material above the surface of the substrate and irradiates both the coating material and the underlying surface of the substrate. By irradiating both the coating material and the underlying surface of the substrate, a first portion of the coating material is melted to form an at least partially molten droplet of coating material. In addition, at least a second portion of the coating material is ablated to thereby create an ablation plume which propels the at least partially molten droplet of coating material toward the substrate. In addition, the portion of the substrate toward which the at least partially molten droplet of coating material is propelled is simultaneously heated, such that the at least partially molten droplet coating material adheres to the heated substrate, thereby coating the surface of the substrate. Thus, a metallic powder can be suspended within a carrier and can be directed along the substrate so as to be irradiated by a pulse of laser energy. The ablation of the coating material also forms at least a second portion of the coating material into a plasma which is deposited within and at least partially fills the depressions or voids within the coating of the substrate following the adherence of the at least partially molten droplet of coating material to the surface of the substrate. Thus, a relatively continuous, smooth coating can be deposited upon the surface of a substrate.

20 Claims, 5 Drawing Sheets

METHOD AND APPARATUS FOR COATING A SUBSTRATE

FIELD OF THE INVENTION

The present invention relates generally to methods and apparatus for coating the surface of a substrate and, more particularly, to methods and apparatus for irradiating a coating material and for propelling the coating material toward the substrate to thereby coat the surface of the substrate.

BACKGROUND OF THE INVENTION

It is oftentimes desirable to coat the surface of a substrate. For example, structural components and engine parts of modern aircraft are commonly coated. In particular, the landing gear and various engine parts of modern aircraft can be coated, such as with a metallic coating, in order to improve the corrosion resistance and wear properties of the coated part and to permit the coated part to withstand relatively large fluctuations in temperature without performance degradation or structural weakening.

Substrates, such as the surfaces of various aircraft parts, are conventionally electrochemically coated with metallic coatings by immersing the substrates in aqueous solutions of various metals, such as nickel, chromium or cadmium. By directing an electrical current through the aqueous solution, metal particulates can be deposited from the aqueous solution onto the surface of the substrate, thereby coating the substrate with a metallic coating. However, due to the potentially harmful effects of aqueous solutions of various metals on the environment, including aqueous solutions of metals, such as nickel, chromium and cadmium, which are employed for electrochemically coating substrates, the electrochemical deposition of metals from an aqueous solution has been significantly restricted by various governmental guidelines and regulations. See, for example, the federal Clean Water Act.

Accordingly, several alternative methods of coating substrates have been developed. For example, coatings have been deposited by chemical vapor deposition methods. As known to those skilled in the art, however, the substrates which are to be coated by chemical vapor deposition must generally be heated to a relatively high temperature, typically ranging from several hundred to 1000° C., to insure that the coating will sufficiently adhere to the substrate. For a number of substrates including metallic substrates, such as steel substrates and, more particularly, tempered steel substrates, which are sensitive to temperature fluctuations, the heating of the substrate to relatively high temperatures can be harmful. For example, the properties of a tempered steel substrate can be irreparably altered or damaged by exposure to the relatively high temperatures required during a chemical vapor deposition process.

In addition, several methods of melting metallic particles with a laser to form a coating on a metallic substrate have been developed. See U.S. Pat. No. 5,122,632 which issued Jun. 16, 1992 to Konrad Kinkelin; U.S. Pat. No. 5,043,548 which issued Aug. 27, 1991 to Erik J. Whitney et al. and which is assigned to General Electric Company; and U.S. Pat. No. 4,300,474 which issued Nov. 17, 1981 to Livsey and is assigned to Rolls-Royce Limited (hereinafter the "Livsey No. '474 patent"). For example, the Livsey No. '474 patent discloses an apparatus for applying metallic coatings to metallic substrates. In particular, the apparatus of the Livsey No. '474 patent simultaneously directs both a laser beam and a gas stream containing entrained particles of a metallic coating material toward a substrate. Due to the power delivered by the laser beam, the metallic particles are melted to form a molten pool of the metallic coating material upon the substrate. Consequently, upon solidification of the molten pool of the metallic coating material, a metallic coating is formed on the substrate.

As specified by the Livsey No. '474 patent, the gas stream containing the entrained particles of the metallic coating material is directed toward the substrate through an inclined tube. Due to the orientation of the inclined tube, the gas stream containing the entrained particles of the metallic coating material is directed both downwardly and laterally toward the surface of the substrate such that the momentum of the gas stream carries the entrained particles of the metallic coating material toward the substrate. In addition, the inclined tube of the apparatus of the Livsey No. '474 patent is oriented such that the gas stream is directed to the same portion of the substrate onto which the laser beam is focused such that the metallic coating particles are melted. However, since the metallic coating particles and the laser beam must be simultaneously directed to the same area of the substrate in order to properly melt the metallic coating particles, the position and orientation of both the laser beam and the inclined tube must be precisely controlled.

SUMMARY OF THE INVENTION

It is therefore an object of the present invention to provide an improved method and apparatus for coating the surface of a substrate.

It is a further object of the present invention to provide an improved method and apparatus for coating the surface of a substrate with a metallic coating.

It is yet another object of the present invention to provide an improved method and apparatus for coating the surface of a temperature-sensitive substrate with a metallic coating.

These and other objects are provided, according to the invention, by a method and apparatus for coating the surface of a substrate which includes suspension means for suspending a coating material above the surface of the substrate and means, such as laser pulse means, for irradiating both the coating material and the underlying surface of the substrate such that the substrate is heated and the coating material is at least partially melted and is propelled toward the heated substrate. More particularly, the coating material and the underlying surface of the substrate are irradiated, such as with a pulse of laser energy, such that at least a first portion of the coating material is melted to form an at least partially molten droplet of coating material. In addition, at least a second portion of the coating material is ablated to thereby create an ablation plume which propels the at least partially molten droplet of coating material toward the substrate. The irradiation of the coating material and the underlying surface of the substrate also heats the portion of the substrate toward which the coating material is propelled. Consequently, the at least partially molten droplet of coating material adheres to and coats the surface of the heated substrate.

According to one preferred embodiment, the coating material and the underlying surface of the substrate are irradiated by a pulse of laser energy which propagates in a predetermined direction. At least a portion of the pulse of laser energy is focused, typically by a particulate of the coating material itself, onto the portion of the substrate towards which the coating material is propelled. Preferably, the coating material particulate which focuses the pulse of laser energy and the portion of the substrate which is thereby heated are aligned along the predetermined direction of propagation of the pulse of laser energy.

The irradiation of the coating material also preferably forms at least the second portion of the coating material into a plasma which, due to its close proximity to the substrate, further coats the substrate. This plasma is deposited within and at least partially fills depressions defined by the coating of the substrate following the adherence of the at least partially molten droplet of coating material to the surface of the substrate. Consequently, a relatively smooth coating can be deposited upon the surface of the substrate. In addition, by repeatedly irradiating the coating material and the underlying surface of the substrate with a series of pulses of laser energy and by scanning the surface of the substrate with the series of pulses of laser energy, a relatively large surface having a complex shape can be coated according to the method and apparatus of the present invention.

In order to suspend the coating material above the surface of the substrate, the coating material, such as a metallic powder, and a carrier can be mixed such that the resulting mixture has a predetermined optical porosity. The mixture can then be directed along the surface of the substrate and irradiated by a pulse of laser energy. The predetermined optical porosity is preferably less than a predetermined maximum optical porosity such that at least a portion of the pulse of laser energy passes through the mixture and heats the portion of the substrate towards which the coating material is propelled. According to the present invention, the carrier can be either a liquid carrier, such as water, acetone or oil, or a gaseous carrier, such as nitrogen, methane, hydrogen or helium. Alternatively, the coating material can be suspended above the surface of the substrate in an electromagnetic field produced by an electromagnetic field generator. In another embodiment, an ultrasound generator can ultrasonically suspend the coating material above the surface of the substrate. In a further embodiment, a sonic transducer can produce a plurality of sonic waves which suspend the coating material above the surface of the substrate.

According to other embodiments of the present invention, an applicator assembly for coating the surface of a substrate can include a coating applicator having a trunk portion and a pair of outwardly extending arm portions in fluid communication with the trunk portion. According to this embodiment, the metal particulates can be held within the trunk portion with a porous plug. The metal particulates can be urged into the arm portions of the coating applicator by an inert gas injected through the porous plug. The metal particulates can then be irradiated, such as by a series of laser pulses, so as to propel the particulates from the coating applicator and toward the surface of the substrate, thereby coating the surface of the substrate.

In an alternative embodiment, the applicator assembly can include a particulate reservoir, such as a tube, having porous plugs disposed within each of the opposed end portions of the tube such that particulates of the coating material can be retained therein. A carrier, such as an inert gas, can be injected from a first end of the tube so as to flow therethrough. The particulate reservoir also defines an orifice which is in fluid communication with the internal cavity of the particulate reservoir and which is preferably oriented so as to face the surface of the substrate to be coated. Accordingly, the carrier and the particulates entrained therein are forced through the orifice and toward the surface of the substrate.

According to this embodiment, the particulates escaping from the particulate reservoir are irradiated, such as with a series of pulses of laser energy, so as to at least partially melt a first portion of the escaping particulates. In addition, the flow of the escaping carrier from the orifice and toward the surface of the substrate propels the at least partially molten particulates toward the surface of the substrate, thereby coating the substrate.

In one advantageous embodiment, the particulate reservoir is comprised of a material, such as plastic, which melts upon exposure to the series of laser pulses. Thus, orifice defined by the particulate reservoir can be formed by the series of laser pulses such that the series of laser pulses will already be focused upon the orifice as the particulates of coating material begin to be forced therethrough by the injected inert gas.

Therefore, according to the present invention, the surface of a substrate can be coated, such as with a metallic coating, without exposing the substrate to elevated temperatures for an extended length of time. Consequently, the coating can be deposited upon a substrate which is relatively sensitive to temperature fluctuations, such as a tempered steel substrate. However, by simultaneously propelling the coating material toward the substrate and heating the particular portion of the substrate toward which the coating material is propelled with a pulse of laser energy, the at least partially molten droplet of coating material will firmly adhere to the surface of the substrate. In addition, by appropriately selecting the carrier in which the coating material is suspended, a coating material which has predetermined characteristics, such as a relatively high carbon content for improved hardness and lubricity, can be produced. Finally, by creating a plasma from at least a portion of the coating material, the depressions or voids within the coating of the substrate following the adherence of the at least partially molten coating material to the substrate are filled by the plasmatized coating material. Thus, a relatively smooth, continuous coating can be produced by the method and apparatus of the present invention.

DETAILED DESCRIPTION OF PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
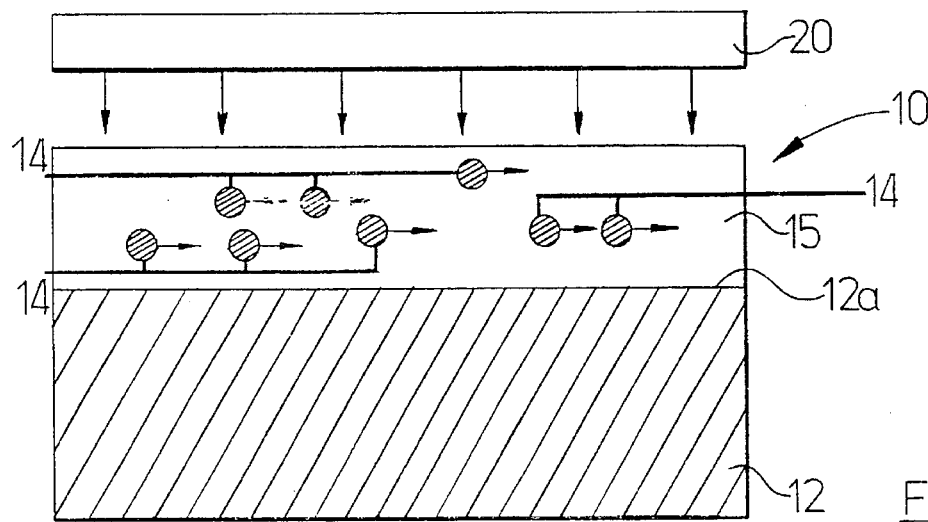
FIG. 1 is a schematic plan view of the coating method and apparatus of one embodiment of the present invention illustrating the suspension of the particulates of the coating material above the surface of the substrate.

Referring now to FIG. 1, an apparatus 10 for coating the surface 12a of a substrate 12 according to the present invention is illustrated. As shown, a coating material is suspended above the surface of the substrate. In one preferred embodiment, the coating material is comprised of a plurality of particulates 14 of a coating material which are suspended above a metallic substrate, such as a steel substrate and, in one more specific embodiment, a tempered steel substrate. For example, the coating material particulates can be a metallic powder, such as nickel, chromium, or cadmium powder. However, the method and apparatus of the present invention can be employed with other types of coating materials and substrates without departing from the spirit and scope of the present invention.

Figure 2:
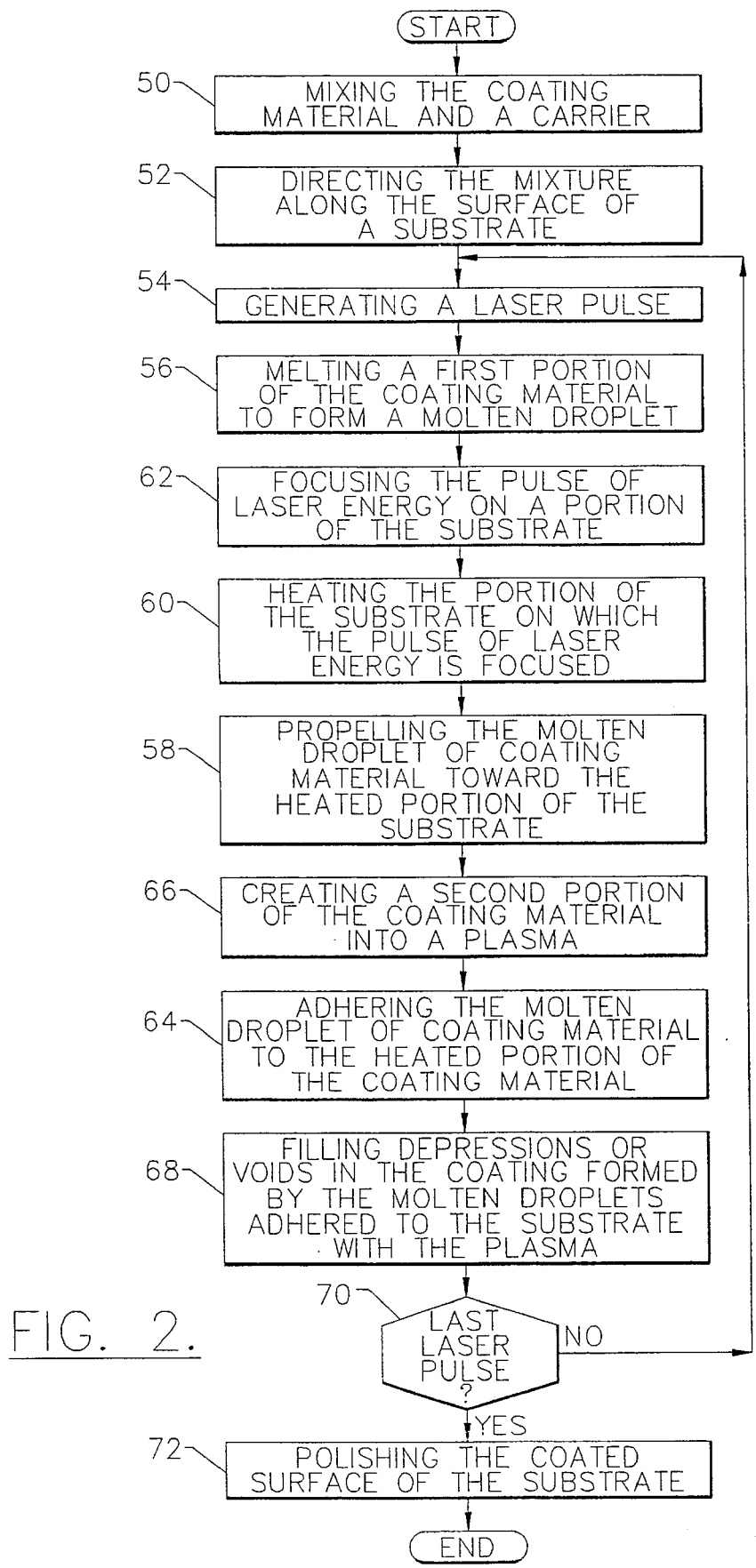
FIG. 2 is a block diagram illustrating the sequence of operations of the method and apparatus of one embodiment of the present invention.

As illustrated in blocks 70 and 72 of FIG. 2, the coating material can be mixed with a carrier 15, such as a liquid or gaseous carrier, and directed along the surface 12a of the substrate 12 in the direction indicated by the arrows such that the particulates 14 of coating material are suspended above the surface of the substrate. For example, the mixture of the coating material and the carrier can be directed along the surface of the substrate with a fluidized bed in either a flowing, agitated or quiescent state. The liquid carrier is typically either water, acetone or oil. Alternatively, the gaseous carrier is generally either nitrogen, methane, hydrogen or helium. However, the carrier can be selected from a variety of other liquids or gasses without departing from the spirit and scope of the present invention. Furthermore, the coating material can be suspended above the surface by a variety of other means as explained hereinafter.

Figure 3:
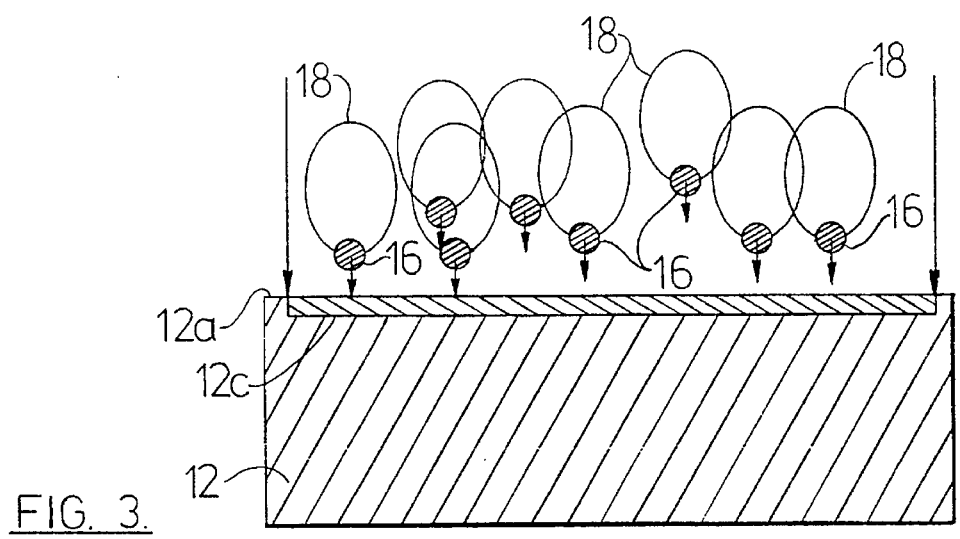
FIG. 3 is a schematic plan view of the particulates of the coating material of FIG. 1 following irradiation in which the at least partially molten droplet of coating material and the ablation plume are shown.
Figure 4:
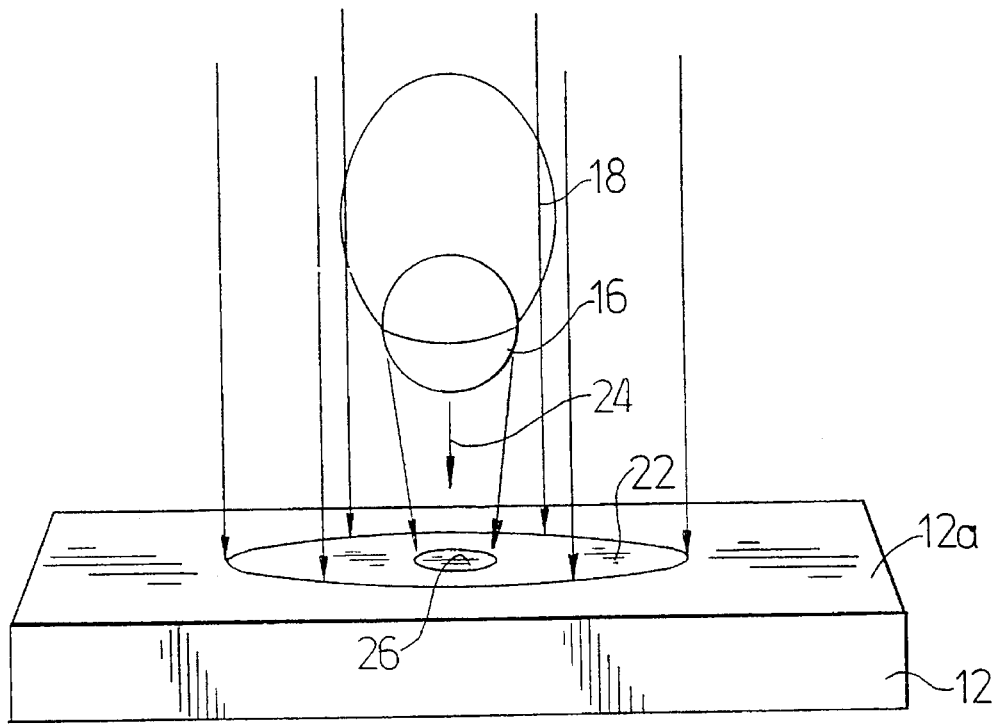
FIG. 4 is a schematic perspective view illustrating the focusing of a pulse of laser energy on the portion of the substrate toward which the at least partially molten droplet of coating material is propelled.
Figure 5:
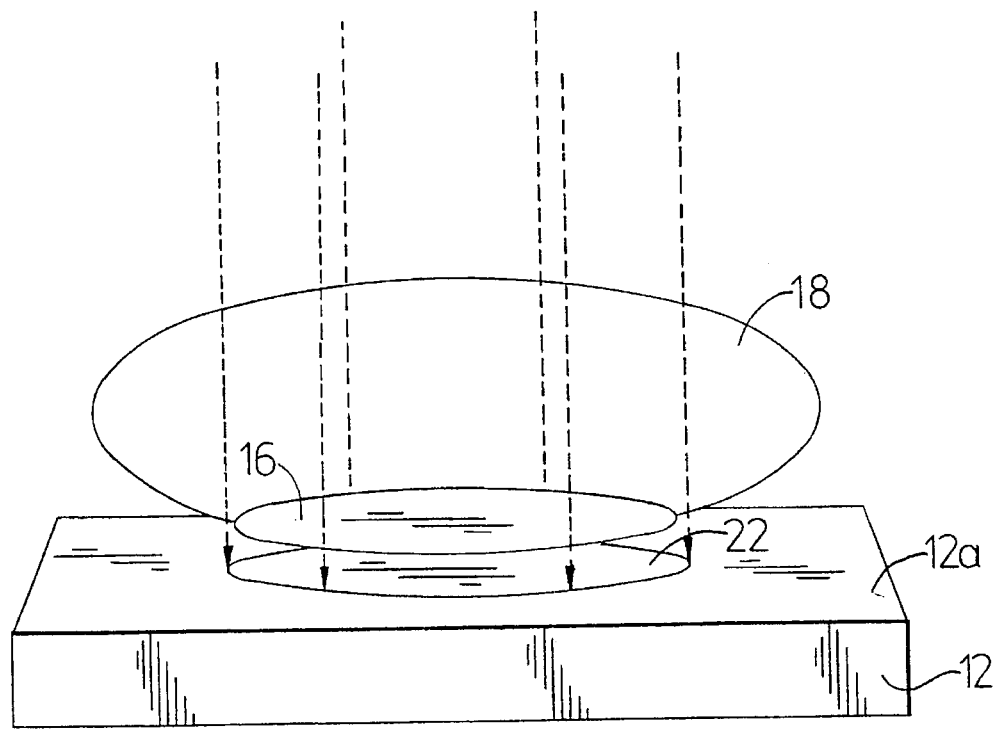
FIG. 5 is a schematic perspective view of the particulate of coating material of FIG. 4 illustrating the flattening of the at least partially molten droplet of coating material and the spreading of the plasmatized coating material.

The coating material and the underlying surface 12a of the substrate 12 are irradiated according to the present invention such that one or more particulates 14 of coating material are at least partially melted and are propelled toward the substrate as shown in FIG. 3 and blocks 56 and 58 of FIG. 2, respectively. In addition, the portion of the substrate towards which the coating material is propelled is simultaneously heated as illustrated in FIGS. 4 and 5 and block 60 of FIG. 2. As shown in FIG. 1 and block 54 of FIG. 2, the coating material and the underlying surface of the substrate are generally irradiated by laser pulse means, such as a laser pulse generator 20, which emits a series of pulses of laser energy. For example, the laser pulse generator of one embodiment is a YAG laser which emits a series of pulses of laser energy, each pulse having an energy of approximately 100 to 200 mJ over 10 nsec at a wavelength of 1.06 µm (microns) with a pulse frequency between 20 to 30 Hz. However, the coating apparatus of the present invention can include a laser pulse generator having a variety of laser parameters and emitting pulses of laser energy having different energy levels and duration without departing from the spirit and scope of the present invention.

As shown in detail in FIGS. 3 and 4, the irradiation of the coating material and the underlying surface 12a of the substrate 12 melts at least a first portion of the particulate 14 of coating material to form an at least partially molten droplet 16 of coating material. In addition, the irradiation propels the at least partially molten droplet of coating material toward a portion of the substrate. Furthermore, the irradiation generally evaporates or otherwise flashes off at least a large portion of the carrier 15, if any is employed, such that the at least partially molten droplets can be propelled relatively unimpeded to the substrate.

More specifically, the irradiation of the coating material and the underlying surface 12a of the substrate 12 ablates at least a second portion of the coating material particulate 14 to thereby create an ablation plume 18, such as a hypersonic ablation plume, which propels the at least partially molten droplet 16 of coating material toward the substrate. As shown in detail in FIG. 5, the at least partially molten droplet of coating material generally flattens as it nears the surface of the substrate to cover a broader surfacial area of the substrate.

In particular, the portion of the particulate 14 of coating material which is directly illuminated by the pulse of laser energy is typically ablated as shown in FIGS. 3 and 4. In addition, the portion of the coating material particulate which is not directly illuminated by the pulse of laser energy, i.e., the portion of the coating material facing away from the laser pulse generator 20, is generally melted. The irradiation also illuminates and heats the portion of the substrate 12 toward which the coating material is propelled as shown by the circle 22 in FIGS. 4 and 5. By simultaneously heating the portion of the substrate toward which the coating material is propelled, the at least partially molten droplet 16 of coating material will firmly adhere to the substrate. More specifically, upon contacting the substrate, the at least partially molten droplet of coating material will splat cool and solidify, thereby coating or plating the surface 12a of the substrate as shown in block 64 of FIG. 2.

Figure 6:
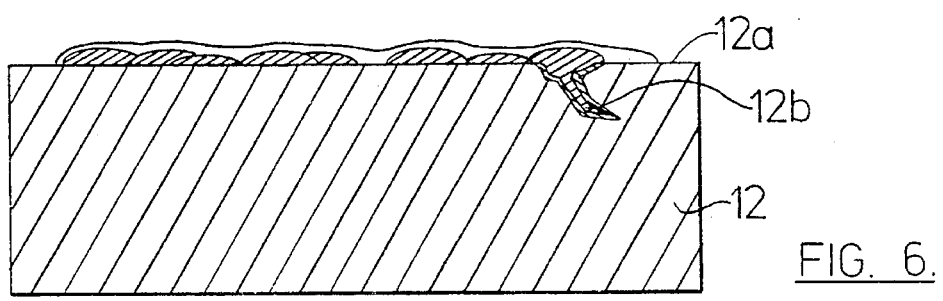
FIG. 6 is a schematic plan view of the surface of the substrate following deposition of both the at least partially molten droplets of coating material and the plasma upon the surface of the substrate illustrating the penetration and fusion of the coating material within cracks in the substrate.

As shown in FIG. 6, the at least partially molten droplets 16 of coating material effectively wet and penetrate the surface 12a of the substrate 12 such that the resulting coating is tightly adhered thereto. In particular, the at least partially molten droplets of coating material are preferably propelled or driven into any cracks 12b defined in the surface of the substrate to further improve the adherence of the resulting coating. In addition, the pressure or thrust created by the ablation plume 18 can drive coalescence between the at least partially molten droplets of coating material and the substrate, particularly in instances in which the surface of the substrate has been fractionally melted by the pulse of laser energy, to enhance the adhesion of the resulting coating to the substrate. Furthermore, the propulsion of the at least partially molten droplets of coating material toward the substrate also compacts and anneals the coating to reduce the sponginess of the resulting coating.

Since the coating material and the underlying surface 12a of the substrate 12 are both preferably irradiated by a pulse of laser energy, the surface of the substrate is heated for only a brief period of time. Thus, the substrate, such as a substrate which is sensitive to temperature fluctuations, such as a tempered steel substrate, can be temporarily heated without damaging the substrate. In addition, by appropriately selecting the frequency and energy of the laser pulses, the heating of even those portions of the substrate which are illuminated, such as the portions within circle 22 of FIGS. 4 and 5, can be limited to the portions of the substrate near the surface to further prevent thermal damage to the substrate. In particular, the method and apparatus of the present invention provides for selective heating of portions 12c of the substrate up to a predetermined maximum depth from the surface of the substrate as shown schematically in FIG. 3. For example, the heating of the substrate can be limited to depths of several microns using the 1.06 μm YAG laser described above.

As illustrated in FIGS. 3–5, each pulse of laser energy generally propagates in a predetermined direction 24 which is preferably perpendicular to the surface 12a of the substrate 12. In addition, each pulse of laser energy is preferably focused, such as by focusing means, onto the portion of the substrate towards which the coating material is propelled as shown in block 62 of FIG. 2. In particular, the particulates 14 of coating material preferably focus the pulse of laser energy by acting as a diffractive lens to form a spot of Arago 26 beneath or below each respective illuminated particulate as shown in FIG. 4. See, for example, J. E. Harvey, et al., "The Spot Of Arago: New Relevance For An Old Phenomenon", *Am. J. Phys.*, Vol. 52, No. 3, pp. 243–247 (March 1984) which defines the spot of Arago as a bright spot at the center of the geometrical shadow of a circular obstruction.

By focusing the pulse of laser energy with the suspended coating material particulates, the portion of the substrate which is most significantly heated can be limited to the portion of the substrate toward which the coating material is propelled and on which the coating material will adhere. Thus, by focusing the pulses of laser energy upon only those areas toward which the coating material will be propelled, the method and apparatus of the present invention further protects the substrate from lengthy exposure to elevated temperatures during the coating process. In addition, in one embodiment of the present invention, an unfocused laser can provide the series of laser pulses since the particulates of coating material effectively focus the laser energy on the surface of the substrate.

The coating material particulate 14 which focuses the pulse of laser energy and the portion of the substrate 12 toward which the coating material is propelled are preferably aligned along the predetermined direction 24 of propagation of the pulse of laser energy. Consequently, the operator of the coating apparatus 10 need not externally align the coating material and the pulse of laser energy since the focusing of the pulse of laser energy by the coating material particulate to the portion of the substrate toward which the coating material is propelled effectively aligns the coating material and the laser pulse generator 20.

Thus, by repeatedly irradiating the coating material and the underlying surface 12a of the substrate 12 with a series of pulses of laser energy and by scanning the surface of the substrate with the series of pulses of laser energy, the surface of the substrate, such as a relatively large, complexly shaped substrate, can be coated with the coating material. In particular, the at least partially molten droplets 16 of coating material, which are propelled toward the substrate, contact and adhere to the heated portion of the substrate. In addition, the ablation of at least the second portion of the coating material creates a plasma from the second portion of the coating material as shown in block 66 of FIG. 2. This plasma is also propelled toward the substrate and, as shown in FIG. 5, spreads into a relatively broad cloud of plasma near the surface of the substrate. Accordingly, the plasma envelops the at least partially molten droplet of coating material and, in preferred embodiments, is deposited within and at least partially fills the depressions, cracks or voids defined by the coating of the substrate following the adherence of the at least partially molten droplets of coating material to the surface of the substrate as illustrated in FIG. 6 and block 68 of FIG. 2. A relatively smooth, contiguous coating can therefore be deposited upon the surface of the substrate. In order to further smooth the surface of the substrate, the coating can be polished, such as with diamond or alumina grit, in order to remove any remaining surface irregularities following completion of the deposition process as shown in blocks 70 and 72 of FIG. 2.

The irradiation provided by the coating apparatus 10 of the present invention can also propel a suspended particle 14 toward the surface 12a of a substrate 12 in instances in which the energy density of the laser pulse is insufficient to ablate the particle. In these instances, the optical radiation pressure provided by the laser pulse can be sufficient to propel or thrust the particle toward the substrate. While the laser pulse may have insufficient energy density to ablate the suspected particulate, the laser pulse will generally strongly heat the substrate and, in some instances, will heat the surface of the substrate to the point of liquification. In these instances, the particle propelled by optical radiation pressure can adhere to and coat the strongly heated or liquified surface of the substrate without having been ablated.

Figure 7:
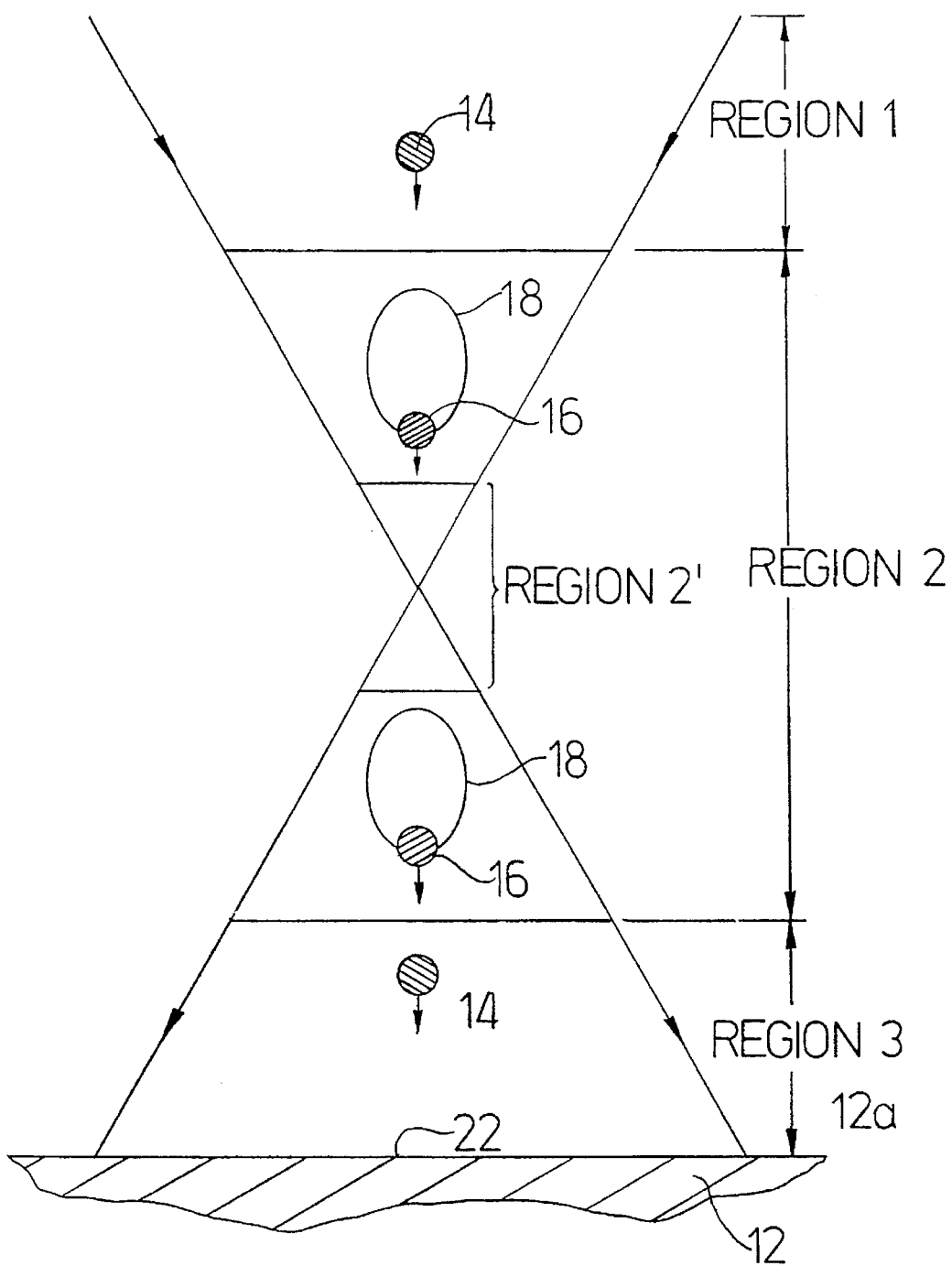
FIG. 7 is a schematic diagram illustrating the various manners in which a particulate of coating material can be propelled toward the surface of the substrate.

As shown in FIG. 7, a pulse of laser energy can propel a particle 14 toward the surface 12a of the substrate 12 according to both optical radiation pressure and ablation. In particular, in Regions 1 and 3 in which the pulse of the laser energy is less concentrated, the particle will not be ablated, but, instead, will be propelled toward the substrate by the optical radiation pressure of the laser pulse. In Region 2 in which the laser pulse is more sharply focused and the resulting energy density of the laser pulse is greater, the particle can be ablated and thereby propelled toward the substrate.

In addition, in a narrow portion of Region 2, designated Region 2', in which the pulse of laser energy is even more focused and the energy density is even greater, the laser pulse can 'detonate' the gas, thereby creating a laser detonation or laser spark. This laser detonation can, in turn, urge or propel particles suspended between the detonation and the surface 12a of the substrate 12, i.e., primarily particles in Region 3, toward the substrate.

According to another aspect of the present invention, the coating deposited upon the surface 12a of the substrate 12 can be patterned. For example, a holographic field can be generated on the surface of the substrate such that the resulting coating is patterned, at least in part, based upon the holographic field. For example, the holographic field can be produced by a number of interfering laser fields such that the deposition of the coating on the surface of the substrate is based, at least in part, upon the lines of intensity of the interfering laser fields.

According to the present invention, the coating material is preferably suspended near to or in contact with the surface 12a of the substrate 12. By irradiating the coating material relatively near to or in contact with the surface of the substrate, the method and apparatus of the present invention can be performed at or near atmospheric pressure. Thus, the deposition need not be performed in a vacuum as required by a number of conventional coating methods in order to obtain sufficient uniformity and smoothness of the resulting coating. Accordingly, the coating apparatus 10 of the present invention can be simplified and need not include a relatively expensive vacuum system. However, the substrate is preferably bathed in a noble gas, such as helium, to prevent oxidation of the substrate.

However, the coating method and apparatus can employ a vacuum system without departing from the spirit and scope of the present invention. For example, metallic particulates or powders 14 can be suspended in a vacuum by a variety of means, such as by electromagnetic, ultrasonic or sonic means as described hereinafter or by the propulsion of the metallic powder via a gas or liquid through an inlet and into the vacuum chamber so as to be suspended near the surface 12a of the substrate 12.

In addition, metallic powder 14 can be dribbled or sprinkled, such as by suitable mechanical means, in a vacuum so as to be suspended near or directed by the substrate 12. For example, the substrate can be positioned such that the surface 12a to be coated is vertically disposed. Thereafter, metallic powder can be sprinkled in a vacuum from above the substrate so as to fall alongside the surface of the substrate. Accordingly, the falling metallic powder can be irradiated so as to be propelled toward and coat the surface of the substrate as described above.

In the embodiment illustrated in FIG. 3, the particulates 14 of coating material are mixed with a carrier 15 and are suspended above the surface 12a of the substrate 12. In this embodiment, the mixture of the coating material and the carrier has a predetermined optical porosity which is preferably less than a predetermined maximum optical porosity. See, for example, U.S. Pat. No. 4,249,545, to Heinz Gretz, et al., which issued Feb. 10, 1981, and A. E. Loeffler, et al., "Optical Porosity And Windspeed Reduction By Coniferous Windbreaks In Southern Ontario", *Agroforestry Systems*, Vol. 17, No. 2, pp. 119–133 (Feb. 1, 1992) which discuss various objects' optical porosity, namely, the ratio or percentage of an object's pore space to the object's non-pore space. For example, the mixture of the coating material and the carrier is preferably less dense than a continuous layer of powder so as to have a density of significantly less than 100%. By having a predetermined density less than the predetermined maximum density, the mixture can be sufficiently dilute such that at least a portion of the pulse of laser energy will pass through the mixture and will heat the portion of the substrate toward which the coating material is propelled to a temperature at which the at least partially molten droplet 16 of coating material will firmly adhere to the heated substrate.

In addition, the coating apparatus 10 of this embodiment also preferably includes a filter positioned downstream of the laser pulse generator 20. Thus, any particulates 14 of coating material which were not deposited during the coating process and which remain in the mixture could be removed and reclaimed by the filter.

While the particulates 14 of coating material are illustratively suspended above the surface 12a of the substrate 12 in a mixture in FIGS. 1 and 3, the suspension of the coating material particulates above the surface of the substrate includes embodiments in which the coating material particulates are in contact with the surface of the substrate without departing from the spirit and scope of the present invention. In this embodiment, the irradiation of the coating material particulates flattens the particulates and drives the coating material particulates into the surface of the substrate such that the coating material firmly adheres to the substrate.

Alternatively, the coating material can be suspended above the surface 12a of the substrate 12 in a variety of other manners. For example, the coating apparatus 10 of the present invention can include an electromagnetic field generator, such as an AC solenoid, which produces an electromagnetic field above or about the substrate. Thus, in this embodiment, a ferromagnetic or paramagnetic coating material can be controllably agitated by the magnetic component of the electromagnetic field above the surface of the substrate. In addition, dielectric coating materials can be suspended and agitated with an electric field, such as the static electricity produced by a VandeGraff generator. Alternatively, the coating apparatus can include an ultrasound generator which ultrasonically suspends the coating material above the surface of the substrate. Still further, the coating apparatus can include one or more sound transducers which generate a plurality of sound or sonic waves which suspend the coating material above the surface of the substrate.

The uniformity of the deposited coating is also enhanced by the random and constantly changing distribution of coating material particulates 14 suspended above the substrate 12 as well as the translation or scanning of the pulses of laser energy over the surface 12a of the substrate. In addition, depressions, cracks or voids in the coating can be filled by a plasma created by the ablation of the coating material as explained above which further improves the uniformity of the resulting coating.

By appropriately selecting the coating material, various types of coatings can be deposited upon a substrate 12 according to the method and apparatus of the present invention. For example, a metallic coating can be deposited upon either a metallic or an insulative substrate by suspending particulates 14 of the metallic coating material, such as a metal powder, above the surface 12a of the substrate. In addition, nonmetallic coatings can be deposited by suspending the desired coating material above the substrate.

Further, the coating material can include two or more different types of coating materials suspended simultaneously above the surface 12a of a substrate 12, such that a composite coating is formed on the surface of the substrate. For example, particulates of both a metallic coating material and a diamond coating precursor material, such as graphite, can be suspended above the surface of the substrate and irradiated such that a metal-diamond composite coating is formed on the substrate. As known to those skilled in the art, a coating which includes diamond or diamond-like particles generally has increased lubricity, hardness and thermal conductivity.

In addition, for embodiments of the present invention in which the particulates 14 of coating material are suspended within a carrier 15 above the surface 12a of the substrate 12, the resulting properties of the deposited coating can be optimized by judiciously selecting the carrier. In particular, while the majority of the carrier is evaporated or flashed off by the irradiation of the mixture by a pulse of laser energy, a relatively small amount of the carrier is generally deposited upon the substrate along with the coating material particulates and is included within the resulting coating. Thus, the carrier can be selected to optimize the properties of the resulting coating. For example, by mixing the coating material with a carrier having a relatively high carbon content, such as acetone or various hydrocarbon oils known to those skilled in the art, the resulting coating will have an increased carbon content. Alternatively, by mixing the coating material with a carrier comprised of both hydrogen gas and a gaseous hydrocarbon, the resulting coating can include a diamond or diamond-like component, thereby creating a metal-diamond composite coating.

A multilayer or graded structure can also be deposited upon the substrate 12 according to the method and apparatus of the present invention by initially depositing a first or base coating by irradiating a first mixture of a first coating material and a carrier. Thereafter, a second coating material can be suspended above the surface of the coated substrate and can be irradiated such that a second coating of the second coating material can be deposited upon the base coating. By repeating these steps with additional coating materials, a multilayer or graded coating having a variety of coating materials can be readily deposited upon the substrate.

In addition, the irradiation of the particulates 14 also heats the surface 12a of the substrate 12 as described above. In some instances, the energy density of the irradiating laser pulses can be sufficient to at least partially evaporate the illuminated portion 22 of the substrate. In particular, the evaporated portion of the substrate is generally plasmatized by the laser pulse. The plasmatized portion of the substrate can then mix with plasmatized second portion of the coating material to produce a compound or composite coating which includes one or more graded or blended layers. By producing a compound or composite coating, the adherence of the coating to the surface of the substrate can be further enhanced.

Figure 8:
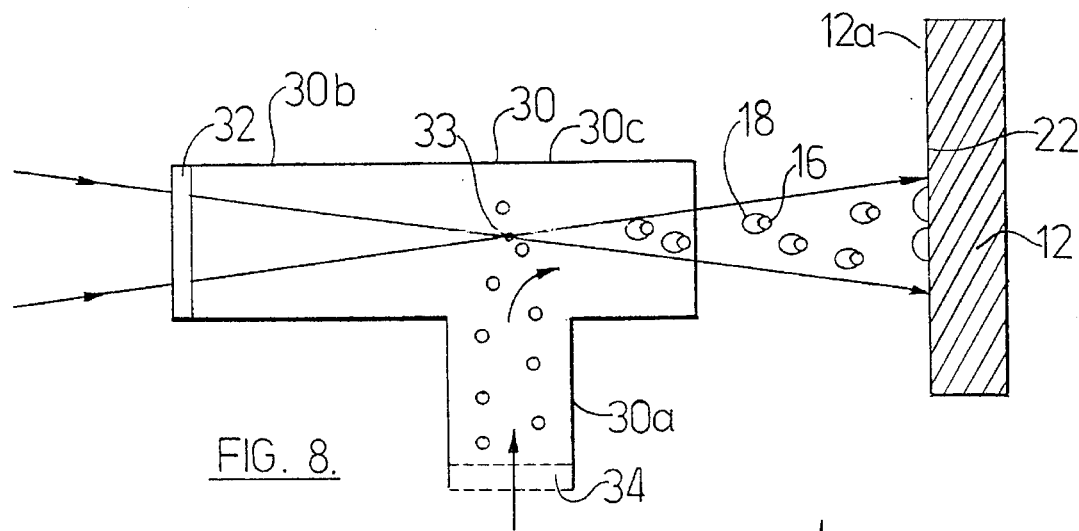
FIG. 8 is a side view of a generally T-shaped applicator according to one embodiment of the present invention which has a trunk portion and first and second opposed arms.

Although various embodiments of the coating method and apparatus have been described heretofore, the coating method and apparatus can also include a variety of alternative embodiments, such as the applicator assemblies illustrated in FIGS. 8–10 and described hereinafter, without departing from the spirit and scope of the present invention. For example, the metal particulates can be disposed within the trunk portion 30a of a coating applicator 30, such as the generally T-shaped applicator illustrated in FIG. 8. The coating applicator can be comprised of a variety of materials, including glass and metal, without departing from the spirit and scope of the present invention.

In particular, the metal particulates 14 can be held within the trunk portion 30a of the coating applicator 30 with a porous plug 34, such as a fritted disk, which is disposed within an open end of the trunk portion. The metal particulates can be urged upwardly, as illustrated by the upwardly directed arrows in FIG. 8, by the injection of a carrier, typically an inert gas, such as nitrogen. The metal particulates can then be irradiated within the upper portion of the coating applicator, such as by a series of laser pulses as described hereinabove. As shown, the laser pulses are preferably focused at a point 33 aligned with and, in the illustrated embodiment, above the trunk portion of the coating applicator so as to irradiate the coating particulates and to propel the particulates through a first arm 30c of the coating applicator and toward the surface of the substrate 12, thereby coating the surface 12a of the substrate. As also illustrated, an optical flat or lens 32 can be disposed within an open end of the second arm 30b of the coating applicator in order to more particularly focus the pulses of laser energy.

Figure 9:
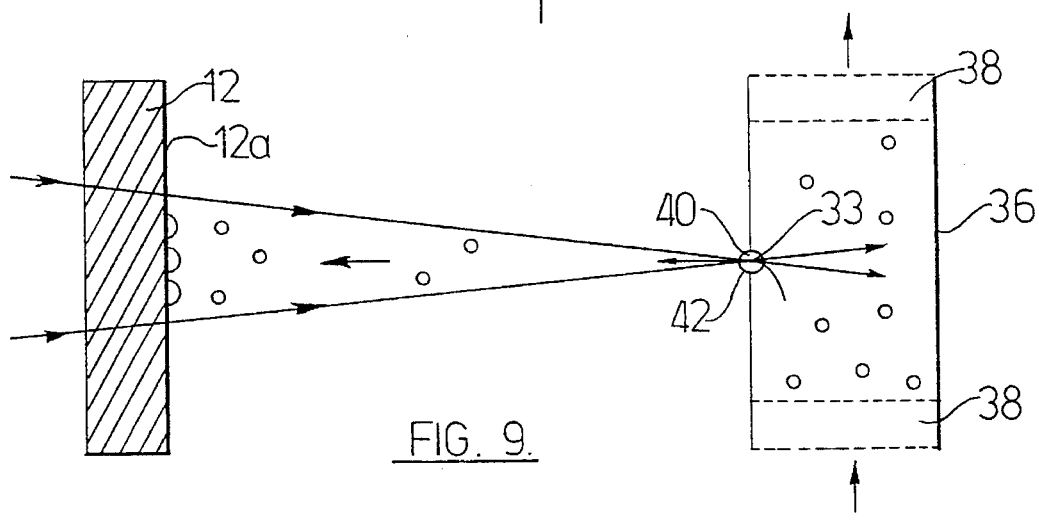
FIG. 9 is a side view of an applicator assembly according to another embodiment of the present invention which includes a tubular particulate reservoir and which illustrates the irradiation of the particulates with an on-axis laser pulse.
Figure 10:
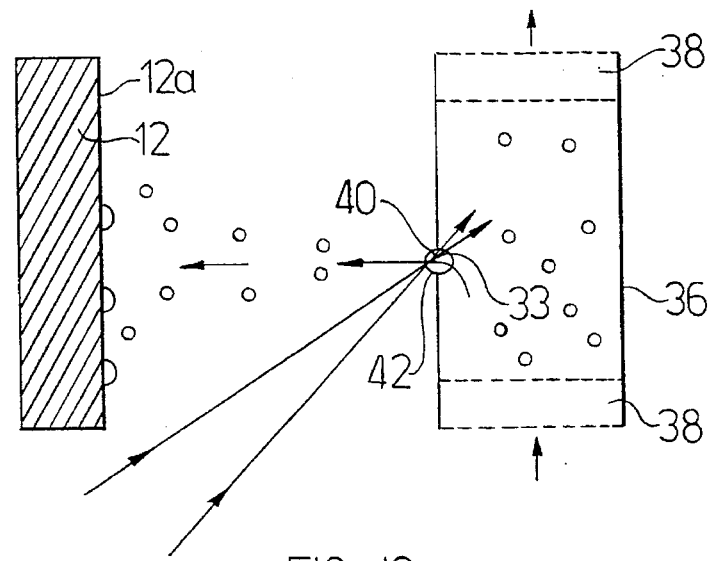
FIG. 10 is a side view of an applicator assembly according to another embodiment of the present invention which includes a tubular particulate reservoir and which illustrates the irradiation of the particulates with an off-axis laser pulse.

In the alternative embodiments illustrated in FIGS. 9 and 10, the metal particulates 14 can be disposed within the internal cavity defined within a particulate reservoir, such as a tube 36. As described above, a porous plug 38 can be disposed within each of the opposed end portions of the tube in order to retain the metal particulates therein. A carrier, such as an inert gas and, in one embodiment, hydrogen, can be injected from a first end of the tube so as to flow therethrough as illustrated by the upwardly directed arrows in FIGS. 9 and 10. The tube also defines an orifice 40 having a relatively small diameter, such as ¼", which is in fluid communication with the internal cavity of the tube and which is oriented so as to face the surface 12a of the substrate 12 to be coated. Accordingly, the carrier and the metal particulates entrained therein flow outwardly through the orifice as shown by the outwardly directed arrow in FIGS. 9 and 10.

According to the present invention, the outwardly flowing metal particulates 14 are irradiated, such as with a series of pulses of laser energy which are focused at a point 33 located within the orifice 40, so as to at least partially melt a first portion 16 of the metal particulates and to ablate at least a second portion 18 of the metal particulates. In one embodiment, the series of pulses of laser energy create a laser plasma from the metal particulates flowing outwardly through the orifice in the circled region designated 42 in FIGS. 9 and 10. In addition, the outward direction of flow of the carrier from the orifice and toward the surface 12a of the substrate 12 propels the at least partially molten particulates toward the surface of the substrate, thereby coating the substrate.

As illustrated in FIG. 10, the series of laser pulses can be provided off-axis, that is, the series of laser pulses can originate or be directed beside of or around the substrate 12. Alternatively, the substrate can be at least partially transparent for light having the predetermined wavelength of the laser pulses. For example, a substrate comprised of fused quartz or silica is at least partially transparent for light having a wavelength of 1.06 nanometers, such as the light generated by the YAG laser described above. Accordingly, in the embodiment illustrated in FIG. 10, the series of laser pulses can be provided on-axis, that is, the series of laser pulses can be directed through the at least partially transparent substrate so as to irradiate the metal particulates 14 escaping from the tube 36.

In one advantageous embodiment, the particulate reservoir, such as tube 36, is comprised of a material which melts or evaporates upon exposure to irradiation, such as the series of laser pulses used to at least partially melt the metal particulates 14. Thus, the metal particulates can initially be disposed within a tube which does not include an orifice 40. Thereafter, the series of laser pulses can be directed toward the portion of the tube from which the metal particulates will desirably escape, such as a portion of the tube which faces the surface 12a of the substrate 12 to be coated. Due to the material properties of the tube, the series of laser pulses will form an orifice in the tube at the point of incidence of the laser pulses. Thereafter, metal particulates entrained in the injected carrier will escape through the orifice, at least partially melted by the laser pulses and be propelled toward the surface of the substrate, thereby coating the surface of the substrate, as described above. By forming the orifice in the tube by irradiating the tube itself with a series of laser pulses, the series of laser pulses need not be focused upon a predefined orifice in the tube, but will, instead, already be focused upon the orifice due to the formation of the orifice in the tube by the series of laser pulses.

Therefore, according to the present invention, the surface 12a of a substrate 12 can be coated, such as with a metallic coating, without exposing the substrate to elevated temperatures for an extended length of time. Consequently, the coating can be deposited upon a substrate which is relatively sensitive to temperature fluctuations, such as a tempered steel substrate, without damaging or otherwise adversely affecting the substrate. However, by simultaneously propelling the coating material toward the substrate and heating the particular portion of the substrate toward which the coating material is propelled with a pulse of laser energy, the at least partially molten droplet 16 of coating material will firmly adhere to the surface of the substrate. In addition, by creating a plasma from at least a portion of the coating material, the depressions or voids within the coating of the substrate following the adherence of the at least partially molten droplets of coating material to the substrate are filled by the plasmatized coating material. Thus, a relatively smooth, continuous coating can be produced by the method and apparatus of the present invention which can be deposited upon relatively large, complexly shaped substrates.

In the drawings and the specification, there has been set forth preferred embodiments of the invention and, although specific terms are employed, the terms are used in a generic and descriptive sense only and not for the purpose of limitation, the scope of the invention being set forth in the following claims.

What is claimed is:

1. A method of coating a surface of a substrate comprising the steps of:

suspending a coating material above the surface of the substrate; and irradiating the coating material and the underlying surface of the substrate, wherein said irradiating step comprises the steps of:

melting at least a portion of the coating material to form a plurality of at least partially molten droplets of coating material;

propelling the at least partially molten droplets of coating material toward a portion of the substrate, wherein said propelling step comprises the step of ablating the at least partially molten droplets of coating material to thereby create ablation plumes which propel the respective at least partially molten droplets of coating material toward the substrate; and heating the portion of the substrate toward which the coating material is propelled such that the at least partially molten droplets of coating material adhere to the heated substrate, thereby coating the surface of the substrate;

wherein said ablating step comprises the step of forming a portion of each of the at least partially molten droplet into a plasma which is propelled toward the substrate and which deposits within and at least partially fills depressions within the coating of the substrate following adherence of the at least partially molten droplets of the coating material to the surface of the substrate.

2. A method according to claim 1 wherein said irradiating step comprises the step of irradiating the coating material and the underlying surface of the substrate with a pulse of laser energy, wherein the pulse of laser energy propagates in a predetermined direction.

3. A method according to claim 2 wherein the coating material comprises a plurality of coating material particulates, wherein said heating step comprises the step of focusing the laser energy with a coating material particulate onto the portion of the substrate toward which the coating material is propelled, and wherein the coating material particulate which focuses at least a portion of the pulse of laser energy and the portion of the substrate which is thereby heated are aligned along the predetermined direction of propagation of the pulse of laser energy.

4. A method according to claim 2 wherein said step of irradiating the coating material and the underlying surface of the substrate with the pulse of laser energy comprises the steps of:

repeatedly irradiating the coating material and the underlying surface of the substrate with a series of pulses of laser energy; and scanning the surface of the substrate with the series of pulses of laser energy to thereby coat the surface of the substrate.

5. A method according to claim 2 wherein said suspending step comprises the steps of:

mixing the coating material and a carrier to form a resulting mixture which has a predetermined optical porosity, wherein the predetermined optical porosity is less than a predetermined maximum optical porosity such that at least a portion of the pulse of laser energy passes through the mixture and heats the portion of the substrate toward which the coating material is propelled; and directing the mixture over the surface of the substrate.

6. A method according to claim 5 wherein said mixing step comprises the step of mixing the coating material and the carrier selected from a group consisting of a liquid carrier and a gaseous carrier.

7. A method according to claim 1 wherein said suspending step comprises the step of suspending the coating material above the surface of the substrate in an electromagnetic field.

8. A method according to claim 1 wherein said suspending step comprises the step of suspending the coating material in a vacuum above the surface of the substrate.

9. A method of coating a surface of a substrate comprising the steps of:

suspending a coating material above the surface of the substrate, wherein said suspending step comprises the steps of:

mixing the coating material and a carrier to form a resulting mixture which has a predetermined optical porosity, wherein said mixing step comprises the step of mixing the coating material and a liquid carrier selected from a group consisting of water, acetone and oil; and directing the mixture over the surface of the substrate; and irradiating the coating material and the underlying surface of the substrate with a pulse of laser energy which propagates in a predetermined direction, and wherein said irradiating step further comprises the steps of:

melting at least a portion of the coating material to form a plurality of at least partially molten droplets of coating material;

propelling the at least partially molten droplets of coating material toward a portion of the substrate, wherein said propelling step comprises the step of ablating the at least partially molten droplets of coating material to thereby create ablation plumes which propel the respective at least partially molten droplets of coating material toward the substrate; and heating the portion of the substrate toward which the coating material is propelled, wherein the predetermined optical porosity of the mixture formed by the coating material and the carrier is less than a predetermined maximum optical porosity such that at least a portion of the pulse of laser energy passes through the mixture and heats the portion of the substrate toward which the coating material is propelled such that the at least partially molten droplets of coating material adhere to the heated substrate, thereby coating the surface of the substrate.

10. A method according to claim 6 wherein said mixing step comprises the step of mixing the coating material and the gaseous carrier selected from a group consisting of nitrogen, methane, hydrogen and helium.

11. A method of coating a surface of a substrate comprising the steps of:

suspending a coating material above the surface of the substrate, wherein said suspending step comprises the step of ultrasonically suspending the coating material above the surface of the substrate; and irradiating the coating material and the underlying surface of the substrate, wherein said irradiating step comprises the steps of:

melting at least a portion of the coating material to form a plurality of at least partially molten droplets of coating material;

propelling the at least partially molten droplets of coating material toward a portion of the substrate, wherein said propelling step comprises the step of ablating the at least partially molten droplets of coating material to thereby create ablation plumes which propel the respective at least partially molten droplets of coating material toward the substrate; and heating the portion of the substrate toward which the coating material is propelled such that the at least partially molten droplets of coating material adhere to the heated substrate, thereby coating the surface of the substrate.

12. A method of coating a surface of a substrate comprising the steps of:

suspending a coating material above the surface of the substrate, wherein said suspending step comprises the step of generating a plurality of sonic waves which suspend the coating material above the surface of the substrate; and irradiating the coating material and the underlying surface of the substrate, wherein said irradiating step comprises the steps of:

melting at least a portion of the coating material to form a plurality of at least partially molten droplets of coating material;

propelling the at least partially molten droplets of coating material toward a portion of the substrate, wherein said propelling step comprises the step of ablating the at least partially molten droplets of coating material to thereby create ablation plumes which propel the respective at least partially molten droplets of coating material toward the substrate; and heating the portion of the substrate toward which the coating material is propelled such that the at least partially molten droplets of coating material adhere to the heated substrate, thereby coating the surface of the substrate.

13. A method of coating a surface of a substrate with a metallic coating, the method comprising the steps of:

suspending a metallic powder within a carrier and above the surface of the substrate;

directing the mixture of the metallic powder and the carrier over the surface of the substrate; and irradiating the mixture and the underlying surface of the substrate with a series of pulses of laser energy, wherein said irradiating step comprises the steps of:

melting at least a first portion of the metallic powder to form a plurality of at least partially molten droplets;

propelling the at least partially molten droplets toward a portion of the substrate, wherein said propelling step comprises the step of ablating the at least partially molten droplets to thereby create ablation plumes which propel the respective at least partially molten droplets toward the substrate; and heating the portion of the substrate toward which the at least partially molten droplets are propelled such that the at least partially molten droplets adhere to the heated substrate, thereby coating the surface of the substrate;

wherein said ablating step comprises the step of forming a portion of each of the at least partially molten droplet into a plasma which is propelled toward the substrate and which deposits within and at least partially fills depressions within the coating of the substrate following adherence of the at least partially molten droplets to the surface of the substrate.

14. A method according to claim 13 wherein the series of pulses of laser energy propagate in a predetermined direction, wherein the metallic powder is comprised of a plurality of metallic powder particulates, and wherein said heating step comprises the step of focusing at least a portion of the pulses of laser energy with a metallic powder particulate onto the portion of the substrate toward which the metallic powder is propelled, wherein the metallic powder particulate which focuses the laser energy and the portion of the substrate which is thereby heated are aligned along the predetermined direction of propagation of the pulses of laser energy.

15. A method according to claim 13 wherein said suspending step comprises the step of mixing the metallic powder and the carrier to form a resulting mixture which has a predetermined optical porosity, wherein the predetermined optical porosity is less than a predetermined maximum optical porosity such that at least a portion of the pulses of laser energy passes through the mixture and heats the portion of the substrate toward which the at least partially molten droplets are propelled.

16. A method of coating a surface of a substrate comprising the steps of:

disposing a plurality of particulates of coating material within an internal cavity defined within a particulate reservoir;

directing a series of pulses of laser energy at a portion of the particulate reservoir which faces the substrate;

forming an orifice in the particulate reservoir with the series of pulses of laser energy;

forcing a plurality of particulates of coating material through the orifice in the particulate reservoir and toward the surface of the substrate; and irradiating the particulates of coating material urged through the orifice in the particulate reservoir, wherein said irradiating step comprises the step of melting at least a portion of the plurality of particulates of coating material to form a plurality of at least partially molten droplets which contact and adhere to the substrate, thereby coating the surface of the substrate.

17. A method according to claim 16 wherein said forcing step comprises the step of injecting an inert gas through the first end of the particulate reservoir to thereby urge a plurality of particulates of coating material through the orifice in the particulate reservoir and toward the surface of the substrate, wherein the injected inert gas propels the plurality of at least partially molten droplets toward the surface of the substrate.

18. A method according to claim 16 wherein said directing step comprises the step of directing the series of pulses of laser energy through the substrate and onto the portion of the particulate reservoir which faces the substrate.

19. A method according to claim 16 wherein said disposing step comprises the step of disposing the plurality of particulates of coating material within the internal cavity defined by a plastic particulate reservoir which extends from a first end to an opposed second end.

20. A method according to claim 19 wherein said disposing step further comprises the step of disposing first and second porous plugs in the first end and the second end of the particulate reservoir, respectively.

* * * * *